United States Patent
Gan

(10) Patent No.: US 12,218,103 B2
(45) Date of Patent: Feb. 4, 2025

(54) RADIATION HARDENED SEMICONDUCTOR DEVICES AND PACKAGING

(71) Applicant: Micron Technology, Inc., Boise, ID (US)

(72) Inventor: Chong Leong Gan, Taichung (TW)

(73) Assignee: Micron Technology, Inc., Boise, ID (US)

( * ) Notice: Subject to any disclaimer, the term of this patent is extended or adjusted under 35 U.S.C. 154(b) by 425 days.

(21) Appl. No.: 17/825,695

(22) Filed: May 26, 2022

(65) Prior Publication Data

US 2023/0387079 A1 Nov. 30, 2023

(51) Int. Cl.
*H01L 25/065* (2023.01)
*H01L 25/00* (2006.01)

(52) U.S. Cl.
CPC .......... *H01L 25/0657* (2013.01); *H01L 25/50* (2013.01); *H01L 2225/06506* (2013.01); *H01L 2225/06537* (2013.01); *H01L 2225/06541* (2013.01); *H01L 2225/06562* (2013.01); *H01L 2225/06586* (2013.01)

(58) Field of Classification Search
CPC ................. H01L 25/0657; H01L 25/50; H01L 2225/06506; H01L 2225/06537; H01L 2225/06541; H01L 2225/06562; H01L 2225/06586; H01L 23/293; H01L 23/3128; H01L 23/3171; H01L 2225/06527; H01L 2225/06565; H01L 23/552; H01L 25/18
See application file for complete search history.

(56) References Cited

U.S. PATENT DOCUMENTS

| | | | | |
|---|---|---|---|---|
| 6,720,493 B1* | 4/2004 | Strobel | ............... | H01L 23/3135 257/E23.114 |
| 2004/0056334 A1* | 3/2004 | Longden | ............... | H01L 23/552 257/E23.114 |
| 2004/0084626 A1* | 5/2004 | McGregor | ............... | G01T 3/08 250/370.13 |
| 2004/0159956 A1* | 8/2004 | Boone | ............... | H01L 23/552 257/E23.114 |
| 2004/0251476 A1* | 12/2004 | Strobel | ............... | H01L 23/552 257/E23.114 |
| 2018/0254233 A1* | 9/2018 | Donzel | ............... | H01L 23/3171 |

OTHER PUBLICATIONS

Lebedev, A.A. et al., "Radiation hardness of the Silicon Carbide", Materials Science Forum, vols. 433-436 (2003), pp. 957-960, 2003 Trans Tech Publications, Switzerland.

* cited by examiner

*Primary Examiner* — Victor A Mandala
(74) *Attorney, Agent, or Firm* — Perkins Coie LLP

(57) ABSTRACT

Radiation hard semiconductor devices and packaging are disclosed. A semiconductor device assembly includes a substrate, a semiconductor die stack electrically coupled to the substrate, and an ionizing radiation shield disposed over a top die of the semiconductor die stack, wherein the ionizing radiation shield comprises silicon carbide (SiC). The semiconductor device assembly further includes an encapsulant at least partially encapsulating the semiconductor die stack and the ionizing radiation shield.

20 Claims, 6 Drawing Sheets

RADIATION HARDENED SEMICONDUCTOR DEVICES AND PACKAGING

TECHNICAL FIELD

The present disclosure generally relates to semiconductor device packaging, and in particular relates to radiation hardened semiconductor devices and packaging.

BACKGROUND

Radiation is a significant concern for electronic applications requiring a high level of reliability. For example, space-based, remote terrestrial, nuclear facility, and medical electronics may require a high degree of radiation hardness. Radiation hardness is commonly understood as the invariability of parameters of a semiconductor or a semiconductor device upon irradiation with ionizing radiation. The larger the irradiation dose necessary for the parameters to start changing, the higher the radiation hardness of a semiconductor.

Depending on the environment, different sources must be considered. Trapped radiation, solar activity, and cosmic rays pose significant risks to space electronics. High energy ionizing particles and photons are used extensively in medical applications. Semiconductor components may change their electronic properties due to radiation. For example, ionizing particles may produce charge in sensitive areas of devices. In general, radiation effects may lead to failures of electronic systems and even to irreversible damage.

BRIEF DESCRIPTION OF THE DRAWINGS

Many aspects of the present technology can be better understood with reference to the following drawings. The components in the drawings are not necessarily to scale. Instead, emphasis is placed on clearly illustrating the principles of the present technology.

DETAILED DESCRIPTION

Figure 1:
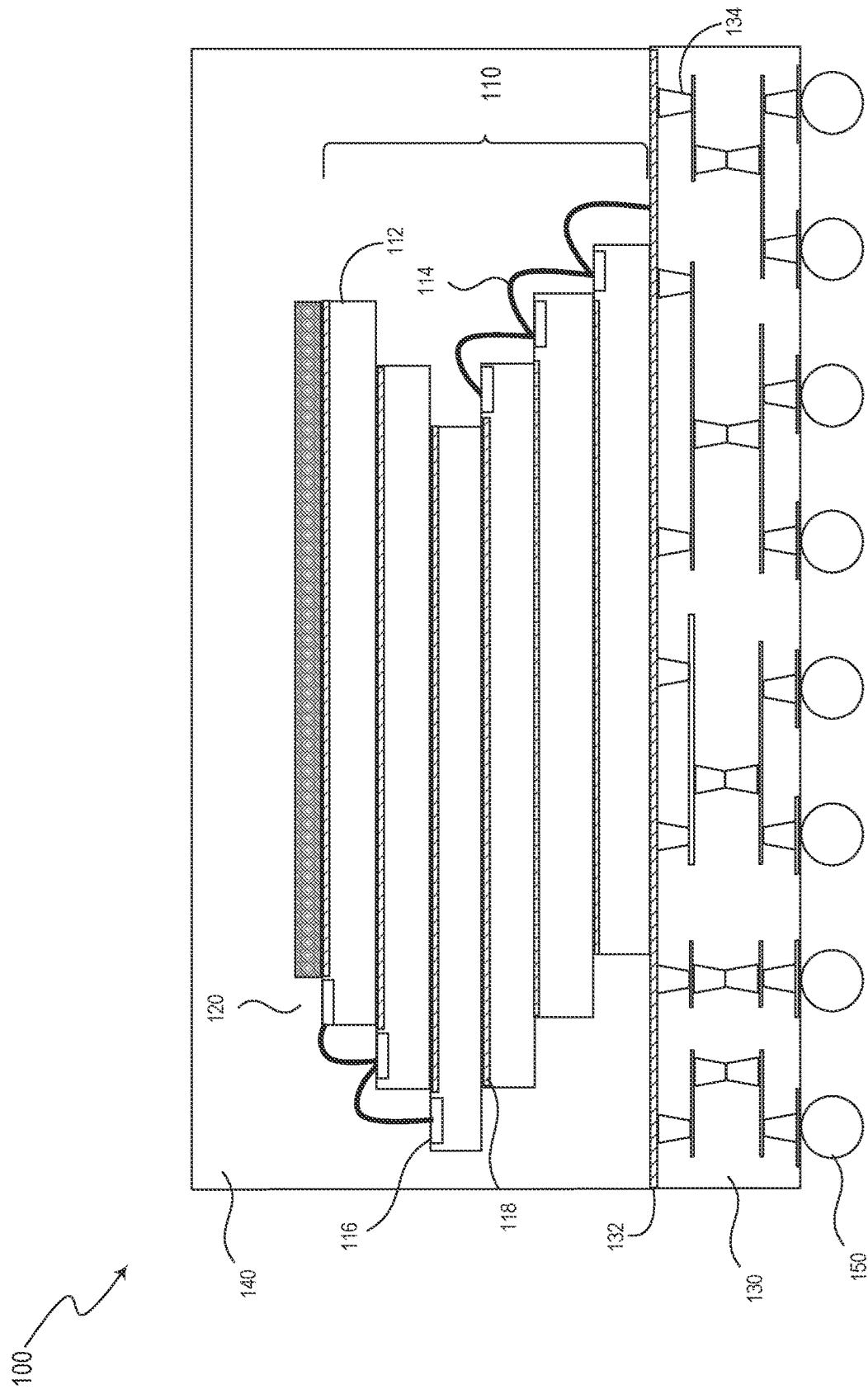
FIG. 1 is a cross-sectional view of a semiconductor package in accordance with embodiments of the present technology.

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device" generally refers to a solid-state device that includes semiconductor material. A semiconductor device can include, for example, a semiconductor substrate, wafer, panel, or a single die from a wafer or substrate. A semiconductor device may further include one or more device layers deposited on a substrate.

The term "semiconductor package" can refer to an arrangement with one or more semiconductor devices incorporated into a common package. A semiconductor package can include a housing, molding, or casing that partially or completely encapsulates at least one semiconductor device. A semiconductor package can also include a substrate that carries one or more semiconductor devices. The substrate may be attached to or otherwise incorporated within the housing or casing.

The term "semiconductor device assembly" can refer to an assembly of one or more semiconductor devices, semiconductor packages, and/or substrates, which may include interposers, supports, and/or other suitable substrates. The semiconductor device assembly may be manufactured as, but not limited to, discrete package form, strip or matrix form, and/or wafer panel form.

As used herein, the terms "vertical," "lateral." "upper," "lower," "above." and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Semiconductor devices are used in a variety of environments that expose the devices to radiation, especially in space and flight applications. Radiation sources include solar radiation, cosmic rays, and trapped particle radiation, such as from radiation belts trapped by magnetic fields. Memory devices are among the devices most susceptible to radiation damage. For instance, long term ionizing damage due to protons and electrons can cause threshold shifts, timing changes, leakage currents, and functional failures.

One method of mitigating the effects of radiation, especially ionizing radiation, on semiconductor devices is with shielding. In this regard, current semiconductor device packaging generally uses ceramic lids or enclosures to attenuate radiation and reduce the dose received at the semiconductor device. These ceramic enclosures often require special grounding mechanisms, such as elongated pin outs, to divert charges and reduce package height. However, current advances in memory devices, such as stacked high bandwidth memory (HBM), make such ceramic enclosures unsuitable. In addition, current device packaging is often subject to strict constraints regarding thinness and other form factor requirements. As such, grounding mechanisms such as elongated pin outs often cannot be used. Thus, shielding approaches that are compatible with a wide variety of semiconductor devices and form factors are needed.

To address these issues, embodiments of the present technology provide a semiconductor device and package that includes an ionizing radiation shield disposed above to a top die of a semiconductor die stack. The ionizing radiation shield protects the semiconductor die stack while minimizing changes to the overall package form factor, compared to applications where radiation shielding is not needed. In some implementations, the ionizing radiation shield comprises silicon carbide, graphene, or carbon nanotubes. Silicon carbide has a relatively wide bandgap and can be used to attenuate radiation. Graphene or carbon nanotubes can be used to mitigate the effects of radiation, for example by conducting stray charges.

In some implementations, a package substrate is electrically coupled to the semiconductor die stack, such as by wire bonding or flip chip bonding. The package substrate can include a graphene layer or interconnects lined with carbon nanotubes that facilitate the grounding and release of stray charges in the semiconductor die stack caused by ionizing radiation. Thus, the grounding mechanisms incorporated into the substrate can be combined with the spot-shielding of the ionizing radiation shield to minimize the effects of radiation on the semiconductor dies. Furthermore, facilitating grounding of the semiconductor dies with the package substrate allows for an adaptable grounding mechanism that can be used with various device shapes and sizes.

FIG. 1 is a cross-sectional view of a semiconductor package 100 in accordance with embodiments of the disclosed technology. As shown in FIG. 1, a semiconductor die stack 110 including a plurality of semiconductor dies 112 is mounted on a substrate 130. The semiconductor dies 112 are electrically coupled to the substrate 130 by wire bonds 114 that extend between bond pads 116. In some implementations, the semiconductor dies 112 are memory dies, such as NAND or DRAM memory dies. The semiconductor die stack 110 can be at least partially encapsulated by an encapsulant 140 to provide structural integrity and environmental sealing, for example if the semiconductor package is accelerated into space. The encapsulant 140 can be a mold material, such as epoxy molding compound (EMC). Although FIG. 1 shows the semiconductor die stack 110 comprising equally sized dies 112 arranged in an offset manner, the present technology is applicable to different sizes and/or arrangements of the dies 112. For example, the semiconductor dies 112 can be arranged in a fan-out arrangement, have varying sizes, etc. In some implementations, total ionizing dose (TID) sensing is integrated in the semiconductor package 100.

An ionizing radiation shield 120 is positioned above the semiconductor die stack 110. The ionizing radiation shield 120 is adapted to protect the semiconductor dies 112 from radiation, such as ionizing radiation, by spot-shielding. For example, the ionizing radiation shield 120 can comprise silicon carbide (SiC), graphene, carbon nanotubes (CNTs), or other suitable shielding material. The ionizing radiation shield 120 can be a silicon carbide die singulated from a wafer of bulk silicon carbide, a layer coated in epitaxial graphene, or a layer coated in CNTs. In some implementations, the ionizing radiation shield 120 is coated in SiC nanoparticles or graphene ink, e.g., a coated silicon wafer. The ionizing radiation shield 120 can include multiple sublayers, such as both a SiC and graphene sublayer. SiC is a wide-bandgap semiconductor that exhibits higher radiation hardness than narrow bandgap materials, though other suitable wide-bandgap materials besides SiC can be used. In some implementations, the ionizing radiation shield 120 is coupled directly to the top die 112 of the semiconductor die stack 110, such as by die attach film. The ionizing radiation shield 120 can have approximately the same plan dimensions as the top die 112, such that substantially all of the top die 112 is shielded from above. In some implementations, the ionizing radiation shield 120 is coupled directly to the top die 112. In some implementations, the ionizing radiation shield 120 is approximately 30 microns thick. For example, the ionizing radiation shield 120 can be thinned by mechanical grinding, plasma grinding, etc.

The semiconductor dies 112 can be made of silicon or silicon carbide. The semiconductor dies 112 can further be coated with a graphene layer 118. For example, the semiconductor dies 112 can be formed by coating a silicon or silicon carbide wafer with graphene ink or growing a layer of epitaxial graphene on the wafer, followed by dicing. In some implementations the graphene layer 118 can be replaced by or supplemented with a carbon nanotube layer, which can be formed using known CNT growth methods. The semiconductor dies 112 can also include a passivation layer on the front and/or back surfaces thereof, such as silicon oxide and/or silicon nitride layers (not shown). The graphene layer 118 can be formed on the passivation layer. The graphene layer 118 further mitigates the effects of ionizing radiation by conducting stray charges away from sensitive portions of the semiconductor dies 112.

The substrate 130 is electrically coupled to the semiconductor die stack 110 and includes internal connections 134. The internal connections 134 are coupled to external connections 150, such as solder balls, which can be coupled to a printed circuit board (PCB). In some implementations, the semiconductor package 100 is a flat no-lead package, such as a quad-flat no-lead (QFN) package. In such a case, the external connections 150 can be fanned out.

The substrate 130 is adapted to provide backside radiation shielding for the semiconductor die stack 110. For example, a graphene layer 132 can simultaneously provide shielding and a ground for the wire bonds 114. The conductive properties of graphene improve grounding of the semiconductor die stack in the event of ionizing radiation, mitigating the amount of damage caused by any unshielded radiation. In some implementations, the substrate 130 is an organic substrate. The internal connections 134 can include vias that are lined with CNTs (not shown), which provide additional backside shielding. Note that the internal connections 134 are shown for illustration, and that alternative arrangements of internal connections 134 can be used. For example, the internal connections 134 can be routed in other paths, include surface traces, be routed to other devices on the substrate, etc. Further detail regarding the substrate is shown below in FIG. 4.

Figure 2:
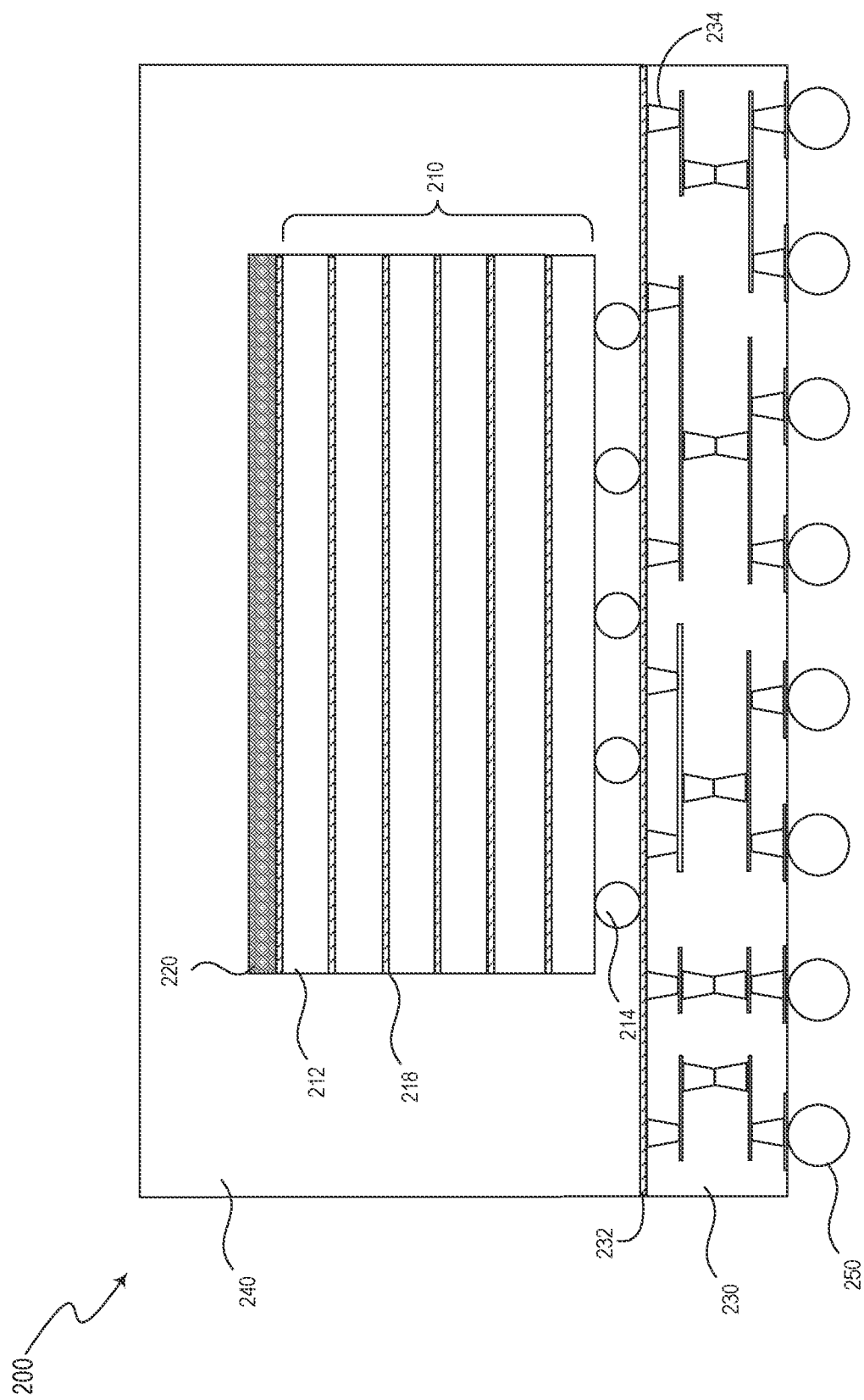
FIG. 2 is a cross-sectional view of a semiconductor package in accordance with embodiments of the disclosed technology.

FIG. 2 is a cross-sectional view of a semiconductor package 200 in accordance with embodiments of the disclosed technology. The radiation shielding and mitigation techniques described in this document is applicable to a variety of devices and packaging. For instance, the semiconductor package 200 is similar to the semiconductor package 100 of FIG. 1. The package 200 includes a semiconductor die stack 210 with a ionizing radiation shield 220 positioned above the die stack 210.

The ionizing radiation shield 220 is generally similar to the ionizing radiation shield 120 of FIG. 1 and provides spot shielding of radiation for the semiconductor die stack 210. The ionizing radiation shield 220 can comprise SiC, graphene, carbon nanotubes (CNTs), or other suitable shielding material. For example, the ionizing radiation shield 220 can be a silicon carbide die, a layer coated in epitaxial graphene, or a layer of CNTs. The ionizing radiation shield 220 can include multiple sublayers, such as both a SiC and graphene sublayer. In some implementations, the ionizing radiation shield 220 is coupled directly to a top die 212 of the semiconductor die stack 210, such as by die attach film.

The semiconductor dies 212 of the die stack 210 are generally similar to the semiconductor dies 112 of FIG. 1. For example, the semiconductor dies 212 can similarly be made of silicon or silicon carbide and optionally coated with a graphene layer 218. For example, the semiconductor dies 212 can be formed by coating a silicon or silicon carbide wafer with graphene ink, or growing a layer of epitaxial graphene on the wafer, followed by dicing. In some implementations the graphene layer 218 is instead a carbon nanotube layer, which can be formed using known CNT growth methods. The semiconductor dies 212 can also include a passivation layer, with the graphene layer 218 formed on the passivation layer.

In contrast to the semiconductor die stack 110 of FIG. 1, which is electrically coupled to the substrate 130 by wire bonds 114, the semiconductor die stack 210 of is flip-chip bonded to the substrate 230. As shown, a bottom semiconductor die 212 is coupled to the substrate 230 by micro-bumps 214. The remaining dies 212 of the semiconductor die stack 210 can be coupled to each other by additional bumps and through silicon vias (TSVs). In some implementations, a combination of wirebonding and flip-chip bonding can be used. Furthermore, the disclosed technology is not limited to the stacking arrangement shown in FIG. 2

The bottom die 212 is flip chip bonded to the substrate 230 via the micro-bumps 214 on a rust side of the bottom die 212. The bottom die 212 can also be coupled to a graphene layer 218 on a second side opposite the first side. Because the bottom die 212 is flip-chip bonded, the graphene layer 218 can be formed on the back surface of each die, and oriented upward towards the top of the stack. Each die 212 of the semiconductor die stack 210 can be comprised of silicon or silicon carbide. The dies 212 can be memory dies, such as NAND or DRAM.

The substrate 230 is similar to the substrate 130 of FIG. 1, including graphene layer 232 and internal connections 234. The internal connections 234 can include CNTs. The graphene layer 232 and the internal connections 234 including CNTs are configured to provide backside shielding from radiation and provide efficient grounding for excess charge caused by radiation. For example, grounding pins of the micro-bumps 214 can be coupled directly to the graphene layer 232. The conductive properties of graphene improve grounding of the semiconductor die stack in the event of ionizing radiation, mitigating the amount of damage caused by any unshielded radiation. The semiconductor die stack 210 can be encapsulated by an encapsulant 240, such as epoxy molding compound. External connections 250 can be used to mount the semiconductor package 200 to another surface, such as a PCB, or can be leads of a metal lead frame.

Figure 3:
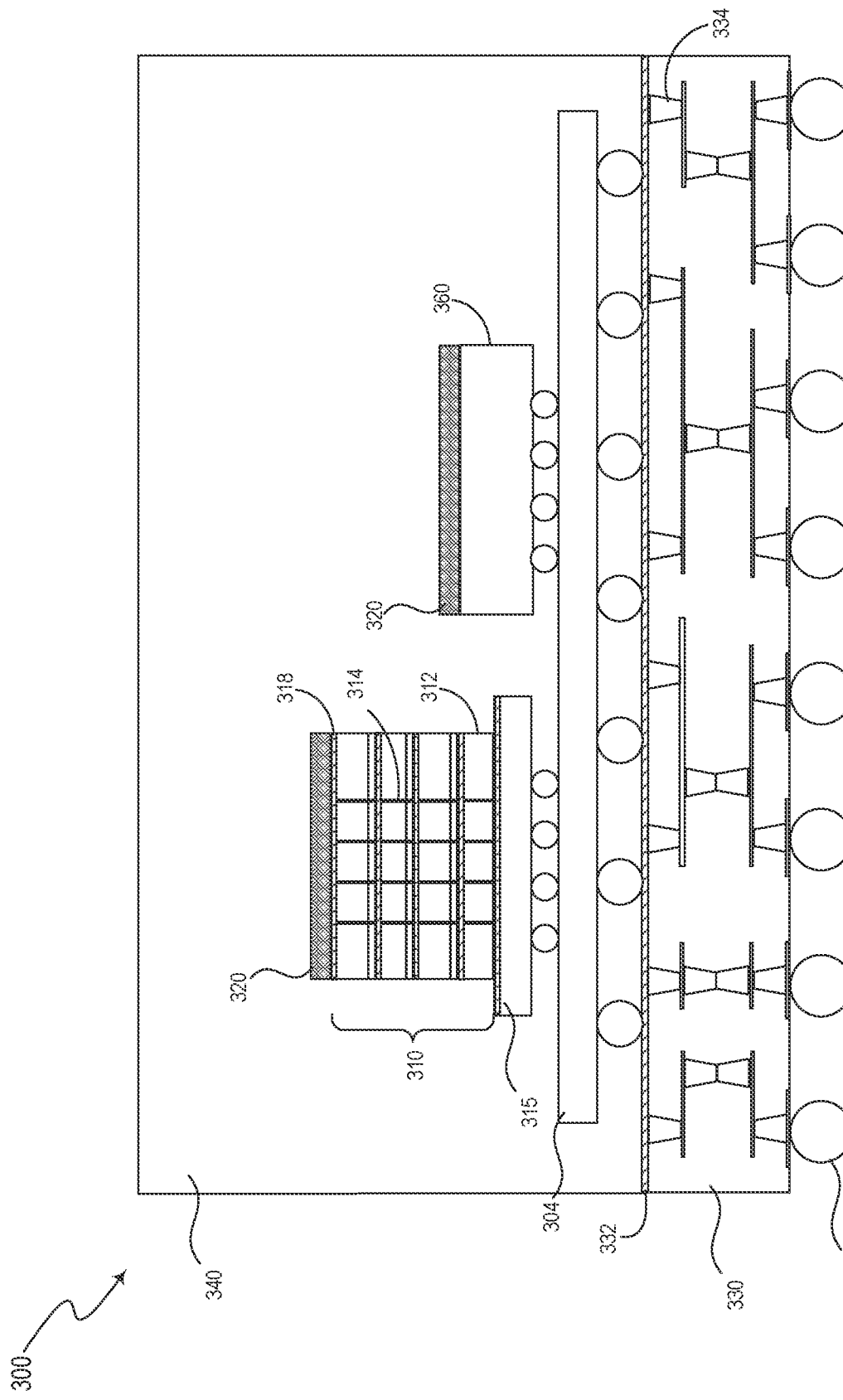
FIG. 3 is a cross-sectional view of a semiconductor package in accordance with embodiments of the disclosed technology.

FIG. 3 is a cross-sectional view of a semiconductor package 300 in accordance with embodiments of the disclosed technology. The semiconductor package 300 is yet another example illustrating the radiation mitigating mechanisms previously described in FIGS. 1 and 2. The semiconductor package 300 includes a substrate 330 similar to substrates 130 and 230 of FIGS. 1 and 2. Internal connections 334 are similar to internal connections 134 and 234, and are coupled to external connections 350, similar to external connections 150 and 250. Graphene layer 332 is similar to the graphene layers 132 and 232 of the previous figures. The semiconductor package 300 further includes an encapsulant 340 similar to encapsulants 140 and 240.

The semiconductor package 300 includes a stack of semiconductor dies 310 with a ionizing radiation shield 320 positioned above. The ionizing radiation shield 320 is similar to the ionizing radiation shields 120 and 220 of FIGS. 1 and 2. The semiconductor die stack 310 is stack of memory dies 312. For example, the die stack 310 can be a stack of DRAM, such as high bandwidth memory (HBM). The semiconductor die stack 310 shown in FIG. 3 includes a plurality of through silicon vias 314 that interconnect the dies 312 of the die stack 310. TSVs are often preferred over alternatives such as wire bonds for certain applications, such as HBM, due to increased speed and higher density of components. The TSVs 314 can comprise any suitable conductor, such as copper or tungsten. In some implementations, the TSVs 314 are also comprised of carbon nanotubes.

The semiconductor dies 312 of the die stack 310 are generally similar to the semiconductor dies 112 and 212 of FIGS. 1 and 2. The semiconductor dies 312 can similarly be made of silicon or silicon carbide and optionally coated with a graphene layer 318. For example, the semiconductor dies 212 can be formed by coating a silicon or silicon carbide wafer with graphene ink, or by growing a layer of epitaxial graphene on the wafer, followed by dicing. In some implementations the graphene layer 318 is instead a carbon nanotube layer, which can be formed using known CNT growth methods. The semiconductor dies 312 can also include a passivation layer, with the graphene layer 318 formed on the passivation layer.

For memory dies 312, the die stack 310 is positioned on a logic die 315. The logic die 315 is electrically coupled to the interposer 304 by a plurality of interconnects (e.g., solder balls) in a direct chip attach (DCA) configuration. The interposer 304 can be attached to the substrate 330 by forming interconnects (e.g., solder balls) between pads on the interposer 304 and interposer contacts on the substrate 330. Any grounding pins of the interposer 304 can be directly attached to the graphene layer 332 of the substrate 330. The interposer 304 can be a printed circuit board (e.g., a daughter board), an organic substrate, a ceramic substrate, a metal lead frame, or even a redistribution layer.

The interposer 304 includes internal connections (not shown) that facilitates an electrical connection from the logic die 315 and the die stack 310 to a processor die 360. e.g., a graphics processing unit (GPU). A second ionizing radiation shield 320 is positioned above the processor die 360. In some embodiments, the semiconductor package 300 includes more than one die stack 310 for each processor die, e.g., 2, 3, 4, or more. In such a case, each additional semiconductor die stack 310 can similarly include a ionizing radiation shield 320.

Moreover, although the above-described examples include logic dies 315, and the dies 312 of the semiconductor die stack 310 disposed over the substrate 330 have been identified as memory dies (e.g., NAND or DRAM, or combinations thereof), those of skill in the art will readily appreciate that the foregoing radiation shielding techniques can be adapted to other die types. For example, in addition to or in place of memory dies, other kinds of semiconductor devices can be provided in a semiconductor device assembly, such as controller dies, application-specific integrated circuit (ASIC) dies, field-programmable gate array (FPGA) dies, etc. In place of an die, other die types can be embedded in a redistribution layer (e.g., memory dies, other logic dies. ASIC dies, FPGA dies, etc.) Furthermore, these various dies can be implemented in a variety of applications, such as solid-state drives (SSDs), dual in-line memory modules (DIMMs), and universal flash storage (UFS).

Figure 4:
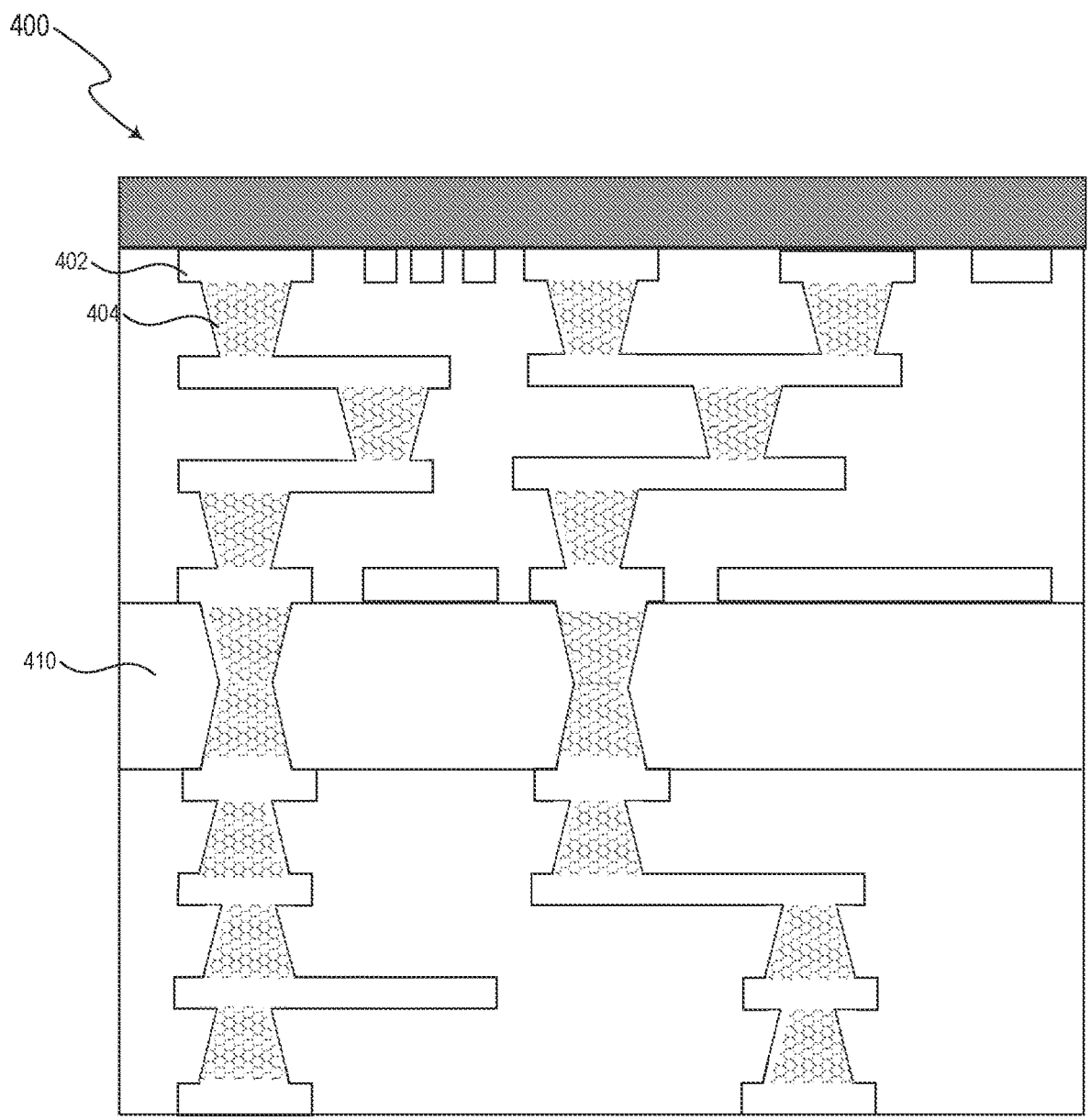
FIG. 4 is a cross-sectional view of a substrate including carbon nanotubes in accordance with embodiments of the disclosed technology.

FIG. 4 is a cross-sectional view of a substrate 400 including carbon nanotubes in accordance with embodiments of the disclosed technology. The substrate 400 can be implemented in any of the semiconductor packages shown in FIGS. 1-3, for example as substrates 130, 230, or 330. The substrate 400 is an organic substrate with internal connections including conductive vias 402. The conductive vias 402 can be formed using standard processes known in the art. The conductive vias 402 can additionally be lined with carbon nanotubes 404. The CNTs 404 provide backside radiation shielding for devices above the substrate 400. For an organic substrate, the substrate 400 can include a core substrate 410. Other suitable substrate materials include silicon, germanium, silicon-germanium alloy, gallium arsenide, gallium nitride, etc. The substrate can be a semiconductor wafer or a silicon-on-insulator (SOI) substrate, such as silicon-on-glass (SOG) or silicon-on-sapphire (SOP), or epitaxial layers of semiconductor materials on another substrate.

Figure 5:
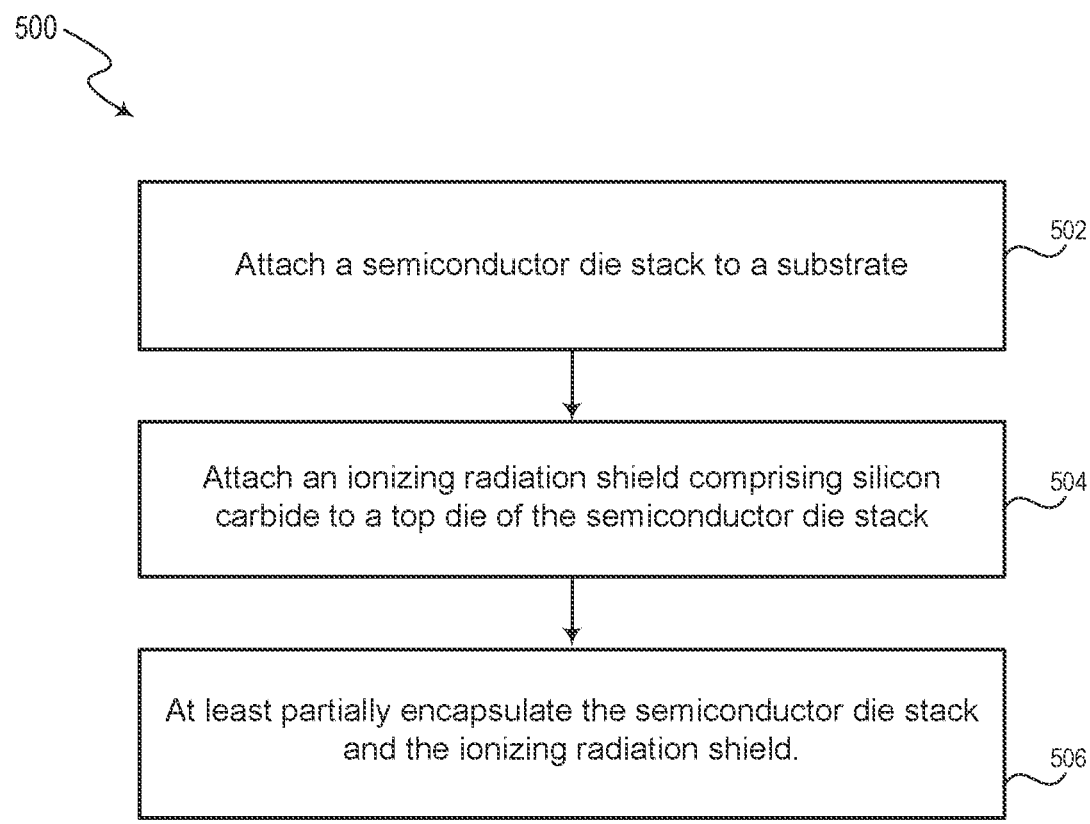
FIG. 5 is a flowchart illustrating a method of fabricating a semiconductor package in accordance with embodiments of the present technology.

FIG. 5 is a flow chart illustrating a method 500 of fabricating a semiconductor package in accordance with embodiments of the present technology. For instance, the method 500 can be used to produce the semiconductor packages 100, 200, or 300 of FIGS. 1-3. At 502, a semiconductor die stack is attached to a substrate. For example, the semiconductor die stack can be attached to the substrate by wire bonding or by flip-chip bonding. In some implementations, the semiconductor die stack comprises a stack of memory dies.

At 504, an ionizing radiation shield comprising silicon carbide is disposed above a top die of the semiconductor die stack. For example, ionizing radiation shield including a SiC wafer can be bonded to the top die. In some implementations, the ionizing radiation shield is attached to the top die at 504 prior to attaching the semiconductor die stack to the substrate at 502. At 506, the semiconductor die stack and the ionizing radiation shield are at least partially encapsulated. For instance, the semiconductor die stack and the ionizing radiation shield can be encapsulated by a mold material, such as epoxy molding compound (EMC), resin, etc.

In some implementations, the ionizing radiation shield further comprises graphene. For example, the graphene can be epitaxially grown on the ionizing radiation shield. In some implementations, the ionizing radiation shield has approximately equal plan dimensions to those of the top die, thus providing spot-shielding for the top die.

In some implementations, the method 500 includes forming a plurality of vias in the substrate, the plurality of vias including carbon nanotubes. The method 500 can also include forming a graphene layer a top surface of the substrate and electrically coupling a ground pin of the semiconductor die stack to the graphene layer. These processes can improve back-side radiation shielding and assist in dissipating charges from the semiconductor dies.

The method 500 can further include disposing an interposer between the substrate and the semiconductor die stack. The interposer includes a first surface facing toward the die stack and a second surface facing toward the substrate. A die, such as a processor die, is attached to the first surface of the interposer. A second ionizing radiation shield can be attached to the die. For example, the second ionizing radiation shield can be attached to the processor die using a similar process as used at 504 for the top die of the semiconductor die stack.

Figure 6:
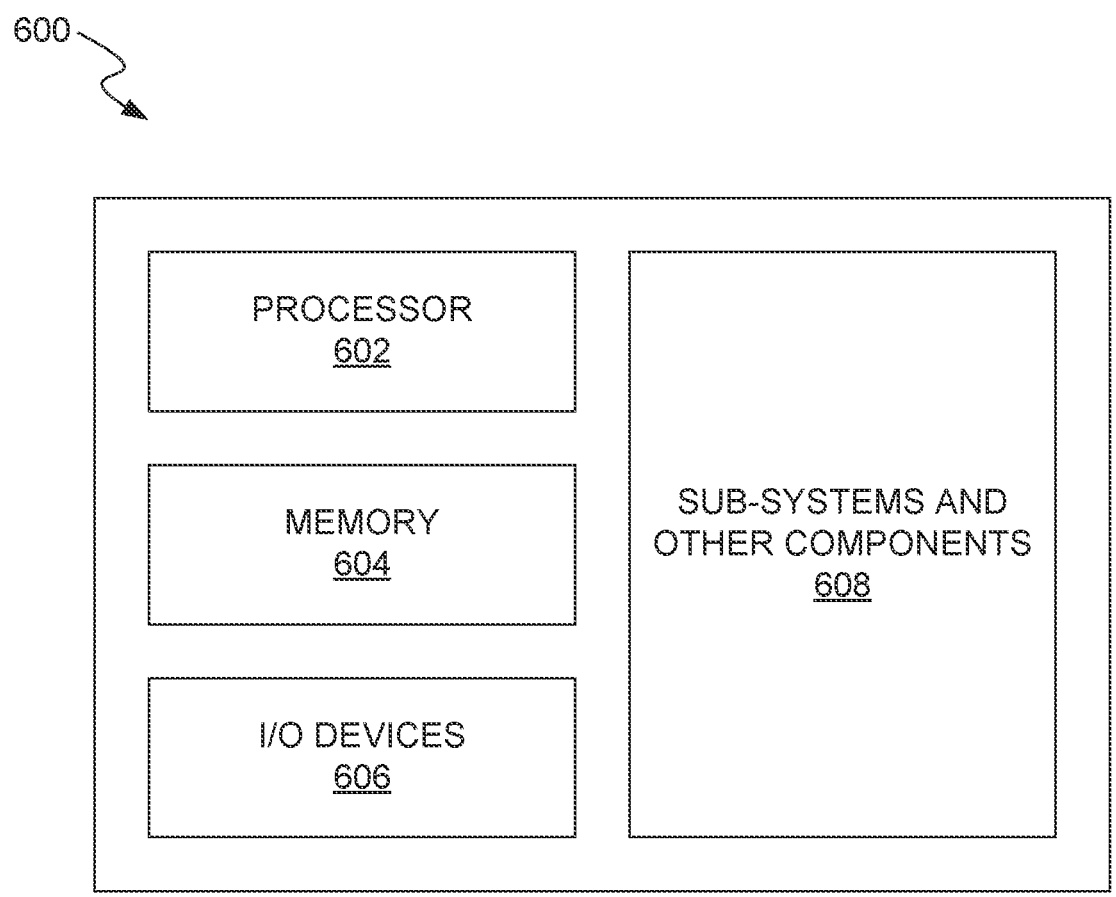
FIG. 6 is a schematic view of system that includes a semiconductor device in accordance with embodiments of the present technology.

FIG. 6 is a schematic view of system that includes a semiconductor device in accordance with embodiments of the present technology. Any one of the semiconductor devices and/or dies having the features described above with reference to FIGS. 1-4, or produced using the processes of FIG. 5, can be incorporated into any of a myriad of larger and/or more complex systems, a representative example of which is system 600 shown schematically in FIG. 6. The system 600 can include a processor 602, a memory 604 (e.g., SRAM, DRAM, flash, and/or other memory devices), input/output devices 606, and/or other subsystems or components 608. The semiconductor dies and/or packages described above with reference to FIGS. 1-4 can be included in any of the elements shown in FIG. 6. The resulting system 600 can be configured to perform any of a wide variety of suitable computing, processing, storage, sensing, imaging, and/or other functions. Accordingly, representative examples of the system 600 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 600 include lights, cameras, vehicles, etc. With regard to these and other examples, the system 600 can be housed in a single unit or distributed over multiple interconnected units (e.g., through a communication network). The components of the system 600 can accordingly include local and/or remote memory storage devices and any of a wide variety of suitable computer-readable media.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed:

1. A semiconductor device assembly comprising:
   a substrate;
   a semiconductor die stack electrically coupled to the substrate;
   an ionizing radiation shield disposed over a top die of the semiconductor die stack, wherein the ionizing radiation shield comprises silicon carbide (SiC); and
   an encapsulant at least partially encapsulating the semiconductor die stack and the ionizing radiation shield.

2. The semiconductor device assembly of claim 1, wherein the ionizing radiation shield has approximately equal plan dimensions to those of the top die.

3. The semiconductor device assembly of claim 1, wherein the ionizing radiation shield further comprises graphene.

4. The semiconductor device assembly of claim 1, wherein at least one die of the semiconductor die stack comprises a silicon carbide layer coupled to an epitaxial layer of graphene or carbon nanotubes.

5. The semiconductor device assembly of claim 1, further comprising:
a plurality of vias disposed within the substrate, the plurality of vias including carbon nanotubes and electrically coupled to a grounding pin of the semiconductor die stack.

6. The semiconductor device assembly of claim 1, further comprising:
a graphene layer disposed on a top surface of the substrate that is electrically coupled to the semiconductor die stack.

7. The semiconductor device assembly of claim 1, wherein the semiconductor die stack comprises a stack of memory dies.

8. The semiconductor device assembly of claim 7, further comprising:
an interposer disposed between the substrate and the semiconductor die stack, the interposer including a first surface facing toward the semiconductor die stack and a second surface facing toward the substrate; and
a processor die coupled to the first surface of the interposer, wherein the processor die includes another ionizing radiation shield.

9. The semiconductor device assembly of claim 1, wherein the semiconductor die stack is flip-chip bonded to the substrate.

10. The semiconductor device assembly of claim 1, wherein the semiconductor die stack includes a through silicon via (TSV) comprised of carbon nanotubes.

11. A method of producing a semiconductor device assembly comprising:
attaching a semiconductor die stack to a substrate;
disposing an ionizing radiation shield comprising silicon carbide (SiC) above a top die of the semiconductor die stack; and
at least partially encapsulating the semiconductor die stack and the ionizing radiation shield.

12. The method of claim 11, wherein the ionizing radiation shield further comprises graphene.

13. The method of claim 11, wherein the ionizing radiation shield has approximately equal plan dimensions to those of the top die.

14. The method of claim 11, further comprising:
forming a plurality of vias in the substrate, the plurality of vias including carbon nanotubes.

15. The method of claim 11, further comprising:
forming a graphene layer a top surface of the substrate; and
electrically coupling a ground pin of the semiconductor die stack to the graphene layer.

16. The method of claim 11, wherein the semiconductor die stack comprises a stack of memory dies.

17. The method of claim 16, further comprising:
disposing an interposer between the substrate and the semiconductor die stack, the interposer including a first surface facing toward the die stack and a second surface facing toward the substrate;
forming a second ionizing radiation shield on a processor die; and
attaching the processor die to the first surface of the interposer.

18. The method of claim 11, wherein attaching the semiconductor die stack to the substrate includes flip-chip bonding a die of the semiconductor stack to the substrate.

19. A semiconductor device assembly comprising:
a semiconductor die stack, wherein each semiconductor die of the semiconductor die stack includes a passivation layer and a first graphene layer formed on the passivation layer;
an ionizing radiation shield positioned above the semiconductor die stack, wherein the ionizing radiation shield comprises silicon carbide (SiC);
an encapsulant at least partially encapsulating the ionizing radiation shield and the semiconductor die stack; and
a substrate electrically coupled to the semiconductor die stack, wherein the substrate includes a graphene layer positioned on a surface facing the semiconductor die stack, the graphene layer configured to provide electrical grounding for the semiconductor die stack.

20. The semiconductor device assembly of claim 19, further comprising:
an interposer disposed between the substrate and the semiconductor die stack, the interposer including a first surface facing toward the semiconductor die stack and a second surface facing toward the substrate; and
a processor die coupled to the first surface of the interposer, wherein the processor die includes another ionizing radiation shield.

* * * * *